United States Patent
Jain et al.

(10) Patent No.: US 8,040,746 B2
(45) Date of Patent: Oct. 18, 2011

(54) EFFICIENT WORD LINES, BIT LINE AND PRECHARGE TRACKING IN SELF-TIMED MEMORY DEVICE

(75) Inventors: Sanjeev Kumar Jain, Ghaziabad (IN); Devesh Dwivedi, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 277 days.

(21) Appl. No.: 12/488,631

(22) Filed: Jun. 22, 2009

(65) Prior Publication Data
US 2009/0316465 A1 Dec. 24, 2009

(30) Foreign Application Priority Data
Jun. 24, 2008 (IN) .............................. 1515/DEL/2008

(51) Int. Cl.
*G11C 7/00* (2006.01)
(52) U.S. Cl. ..................................... 365/203; 365/210.1
(58) Field of Classification Search .................. 365/203, 365/210.1, 230.06, 94
See application file for complete search history.

(56) References Cited

U.S. PATENT DOCUMENTS

| | | | | |
|---|---|---|---|---|
| 5,432,747 A | * | 7/1995 | Fuller et al. | 365/203 |
| 5,745,421 A | * | 4/1998 | Pham et al. | 365/203 |
| 6,160,746 A | * | 12/2000 | Park et al. | 365/203 |
| 6,282,131 B1 | | 8/2001 | Roy | |
| 6,711,092 B1 | | 3/2004 | Sabharwal | |
| 2009/0316464 A1 | * | 12/2009 | Sharma et al. | 365/94 |

* cited by examiner

*Primary Examiner* — Anh Phung
(74) *Attorney, Agent, or Firm* — Charles Bergere (57) ABSTRACT

A memory device for efficient word line, bit line and precharge tracking is provided. The memory device includes a memory array, one or more address decoders, a word line driver, a plurality of sense amplifiers, a reference word line column, a reference bit line column, and a control circuit. The control circuit generates a control signal to perform read and write operations on the memory device. The address decoder selects a bit line and a word line. The selected word line is activated by the word line driver. While the reference word line column is used for vertical tracking of the word line, the reference bit line column is used for vertical tracking of the bit line. The sense amplifiers are activated to read the bit line.

9 Claims, 9 Drawing Sheets

FIG. 8

EFFICIENT WORD LINES, BIT LINE AND PRECHARGE TRACKING IN SELF-TIMED MEMORY DEVICE

BACKGROUND OF THE INVENTION

The present invention relates to memory devices. In particular, the present invention relates to an efficient word line, bit line and precharge tracking in self-timed memory devices.

Figure 1:
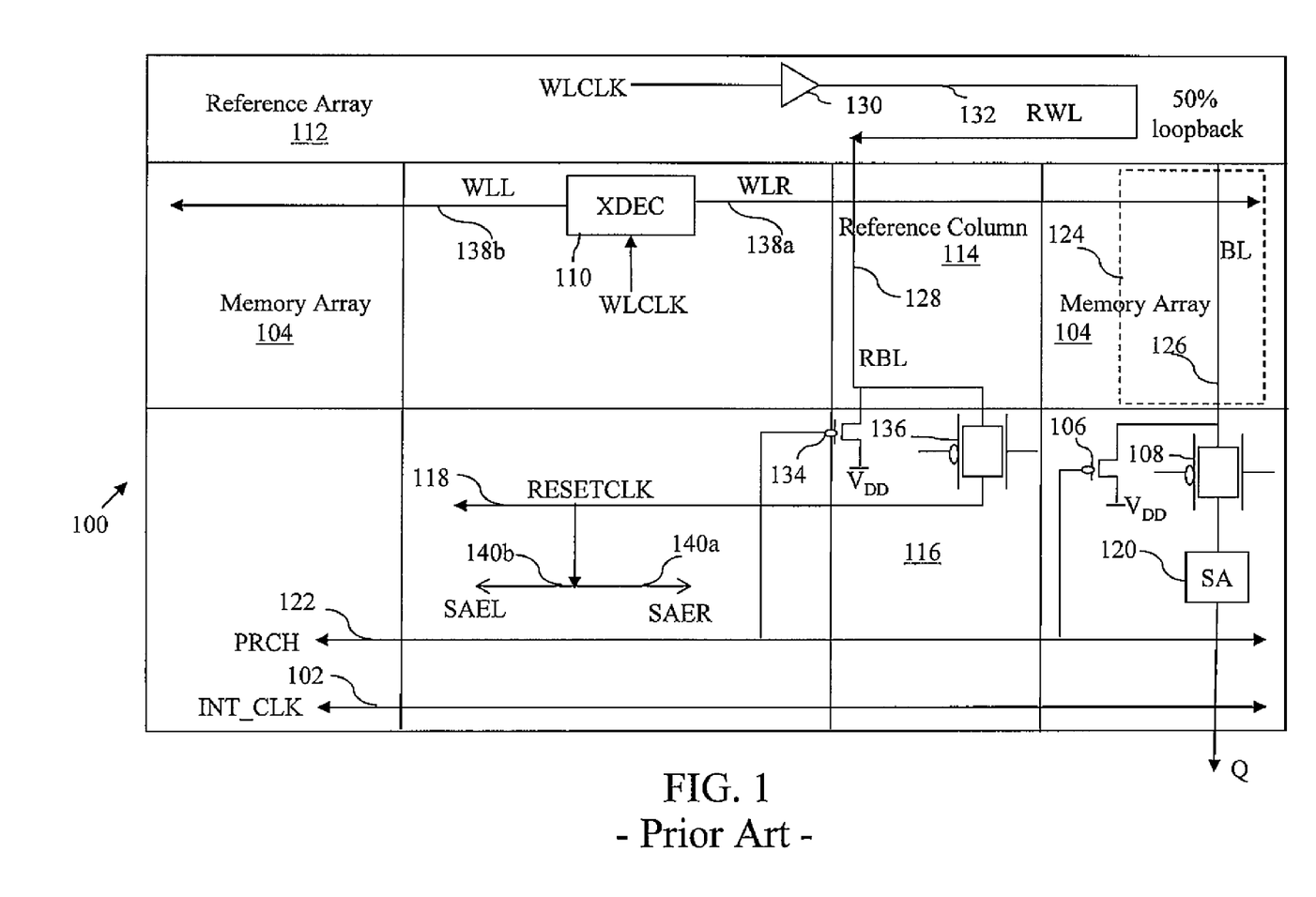
FIG. 1 is a block diagram of a conventional memory device.

Referring to FIG. 1, a circuit diagram of a conventional memory device 100 is shown. The memory device 100 includes an internal clock line 102, a memory array 104, a first precharge transistor 106, a first transmission gate 108, an address decoder (XDEC) 110, a reference array 112, a reference column 114, a reference input/output (IO) 116, a reset clock 118, a sense amplifier 120, and a precharge line 122. All the internal clock signals in the memory device 100 are generated on the internal clock line 102. The memory array 104 includes a plurality of bit line columns 124, one of which is shown. The bit line column 124 includes a plurality of bit lines 126 (again, one of which is shown). The bit line 126 is connected to a plurality of memory cells, which are further connected to a plurality of word lines (not shown). The reference column 114 includes a Reference Bit Line (RBL) 128. The reference array 112 includes a dummy decoder 130 and a fifty (50) percent loopback 132. The reference IO 116 includes a second precharge transistor 134 and a second transmission gate 136.

The bit line 126 and the RBL 128 are precharged to a first predefined threshold voltage by a precharge signal (PRCH) that is generated on the precharge line 122 before a read operation. Precharging of the bit line 126 and the RBL 128 results in a high read current and a fast read operation. The first predefined threshold voltage is defined by a user, based on the voltage ($V_{DD}$) applied to the memory device 100. The first predefined threshold voltage generally lies in the range of about 90 to 98 percent of the applied voltage $V_{DD}$. Precharging of the bit line 126 and the RBL 128 is performed by the first and second precharge transistors 106 and 134, respectively. The drain terminals of both of the precharge transistors 106 and 124 are connected to the applied voltage ($V_{DD}$) line. A word line clock signal is generated on a Word Line Clock Line (WLCLK) to start the read operation. The word line clock signal is provided to the XDEC 110, which generates a Word Line Enable Right (WLR) signal 138a and a Word Line Enable Left (WLL) signal 138b, to enable at least one of the plurality of word lines. The word line clock signal is also provided to the dummy decoder 130, which generates a reference word line signal in the reference array 112. The reference word line signal is generated at the same time as the XDEC 110 generates the WLR 138a and the WLL 138b, to provide simultaneous vertical tracking of the word line by the word line clock signal and horizontal word line tracking in the reference array 112. Horizontal word line tracking is performed by fifty (50) percent loopback 132, which includes dummy cells.

The reference word line signal is provided to the reference column 114. When the reference word line signal reaches the reference column 114, discharging of the bit line 126 and the RBL 128 are initiated. The reference column 114 includes dummy memory cells connected to the RBL 128. Therefore, the RBL 128 tracks the bit line 126 through the reference signal in the reference column 114. When the bit line 126 and the RBL 128 discharge to a second predefined threshold voltage, the first transmission gate 108 selects the bit line 126, and the second transmission gate 136 selects the RBL 128.

The second predefined threshold voltage is defined as the voltage at which one or more inverters that are included in the sense amplifier 120 trip.

Thereafter, the reference IO 116 generates the reset clock 118, a Sense Amplifier Enable Right (SAER) signal 140a and a Sense Amplifier Enable Left (SAEL) signal 140b. The reset clock 118 pulls down the internal clocks generated on the internal clock line 102. The SAER signal 140a and the SAEL signal 140b enable the sense amplifier 120 to read the data stored on the bit line 126. The output of the bit line 126 is referred to as Q.

The memory device 100 described above suffers from wastage of area in the reference array 112 in spite of the advances made in memory architecture technology that have led to the development and use of 45 nanometer (nm) technologies. As explained with reference to FIG. 1, the reference array 112 includes the fifty (50) percent loopback circuit 132 for horizontal word line tracking. The remaining area of the reference array 112 is wasted, which leads to high fabrication cost for the memory device 100.

Further, the memory device 100 only uses logic delays to perform read and write operations. Logic delays are provided by the internal clock line 102 and generated in the memory device 100. Logic delays do not, however, provide sufficient accuracy to track variations in Resistance (R) and Capacitance (C) of the plurality of bit lines and the plurality of word lines, especially the levels of accuracy needed to comply with six sigma variations. Further, logic delays are not efficient in controlling the precharge signal generated on the precharge line 122. Therefore, tracking of the plurality of bit lines, plurality of word lines, and precharge are not accurate.

BRIEF DESCRIPTION OF THE DRAWINGS

The following detailed descriptions of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

A detailed description of the appended drawings is intended as a description of the currently preferred embodiments of the present invention, and not intended to represent the only form in which the present invention may be practiced. It is to be understood that the same or equivalent functions may be performed by different embodiments, which are intended to be encompassed within the spirit and scope of the present invention.

In an embodiment of the present invention, a memory device is provided. The memory device includes a memory array, one or more address decoders, a word line driver, a plurality of sense amplifiers, a reference word line column, a reference bit line column, and a control circuit. The control circuit further includes a dummy decoder, a first programmable delay circuit, and a sense amplifier enable driver. The memory array includes a plurality of bit line columns, which further include a plurality of memory cells. Each memory cell of the plurality of memory cells is connected to a plurality of word lines, which are included in the memory device. The one or more address decoders select at least one of the plurality of bit lines and word lines. At least one of the plurality of word lines is activated by the word line driver. Further, each of the plurality of sense amplifiers is associated with a corresponding bit line of the plurality of bit lines, to sense the corresponding bit line. The reference word line column is used for the vertical tracking of at least one of the plurality of word lines through a first predefined loopback. In contrast, the reference bit line column is used for the vertical tracking of at least one of the plurality of bit lines by using a second predefined loopback. The reference bit line is included in the reference bit line column. The dummy decoder generates a reference word line signal. The first programmable delay circuit is connected to the dummy decoder for programming a delay of the generated reference word line signal. The sense amplifier enable driver activates the sense amplifier. For horizontal tracking of the word line, the fan-out of the sense amplifier enable driver is equal to the fan-out of the word line driver.

In another embodiment of the present invention, a zero leakage Read Only Memory (ROM) is provided. The zero leakage ROM includes a memory array, one or more address decoders, a plurality of sense amplifiers, a reference word line column, a reference bit line column, and a control circuit. The control circuit further includes a precharge generator, a word line clock generator and a sense amplifier enable generator. The memory array includes a plurality of bit line columns connected to a plurality of bit lines. Each of the plurality of bit line columns includes a plurality of memory cells. Each of the plurality of memory cells is connected to a plurality of word lines. Further, the one or more address decoders select at least one of the plurality of bit lines and word lines. Each of the plurality of sense amplifiers is associated with a corresponding bit line of the plurality of bit lines, to sense the corresponding bit line. Vertical tracking of at least one of the plurality of word lines is performed by using a first predefined loopback. In contrast, the reference bit line column is used for vertical tracking of at least one of the plurality of bit lines by using a second predefined loopback. The reference bit line is included in the reference bit line column. Further, the precharge generator generates a precharge signal, which precharges the reference bit line and at least one of the plurality of bit lines to a first predefined threshold voltage. The word line clock generator generates a word line enable signal when the bit line and the reference bit line are precharged to the first predefined threshold voltage. The sense amplifier enable generator generates a signal to activate the sense amplifier of the plurality of the sense amplifiers, to perform the read operation.

In yet another embodiment of the present invention, a method for performing a read operation in a zero leakage ROM, based on bit line precharge and discharge tracking is provided. The zero leakage ROM includes a plurality of bit line columns connected to a plurality of bit lines. Each of the plurality of bit line columns includes a plurality of memory cells. Each of the plurality of memory cells is connected to a plurality of word lines. Precharging of at least one of the plurality of bit lines and the reference bit line is initiated based on a precharge signal. When at least one of the plurality of bit lines and the reference bit line is precharged to the first predefined threshold voltage, a word line enable signal is generated. Based on the word line enable signal, at least one of the plurality of word lines is activated. When the read operation is performed, discharging of at least one of the plurality of bit lines and the reference bit line is performed. The reference bit line performs vertical tracking of at least one of the plurality of bit lines by using a first predefined loopback. Thereafter, a sense amplifier of the plurality of sense amplifiers is activated, to perform the read operation. The sense amplifier corresponds to at least one of the plurality of bit lines and the reference bit line, which discharges to the second predefined threshold voltage.

The embodiments of the present invention provide a memory device in which efficient word line, bit line and precharge tracking are performed. The memory device of the present invention implements horizontal tracking of a word line of the plurality of word lines using the same fan-out of the sense amplifier enable driver and the word line driver. This eliminates the need for the reference array 112 used for horizontal word line tracking shown in FIG. 1. Further, to save area in the zero leakage ROM device, precharge and discharge bit line tracking are performed by the second predefined loopback. One or more programmable delays are implemented in the memory device of the present invention to accurately track word lines, precharging and discharging of bit lines. The one or more programmable delays enable a user to program delays in the corresponding signals for compliance with six sigma variations. Programmable delays ensure that the precharging of bit lines is shut off before a signal is generated on the word line. This lessens short-circuit power dissipation between a device, which is suitable for precharging, and the memory cell. Further, in the zero leakage ROM device, power saving is provided by an improvement in the sense amplifier enable generator circuit design.

Figure 2A:
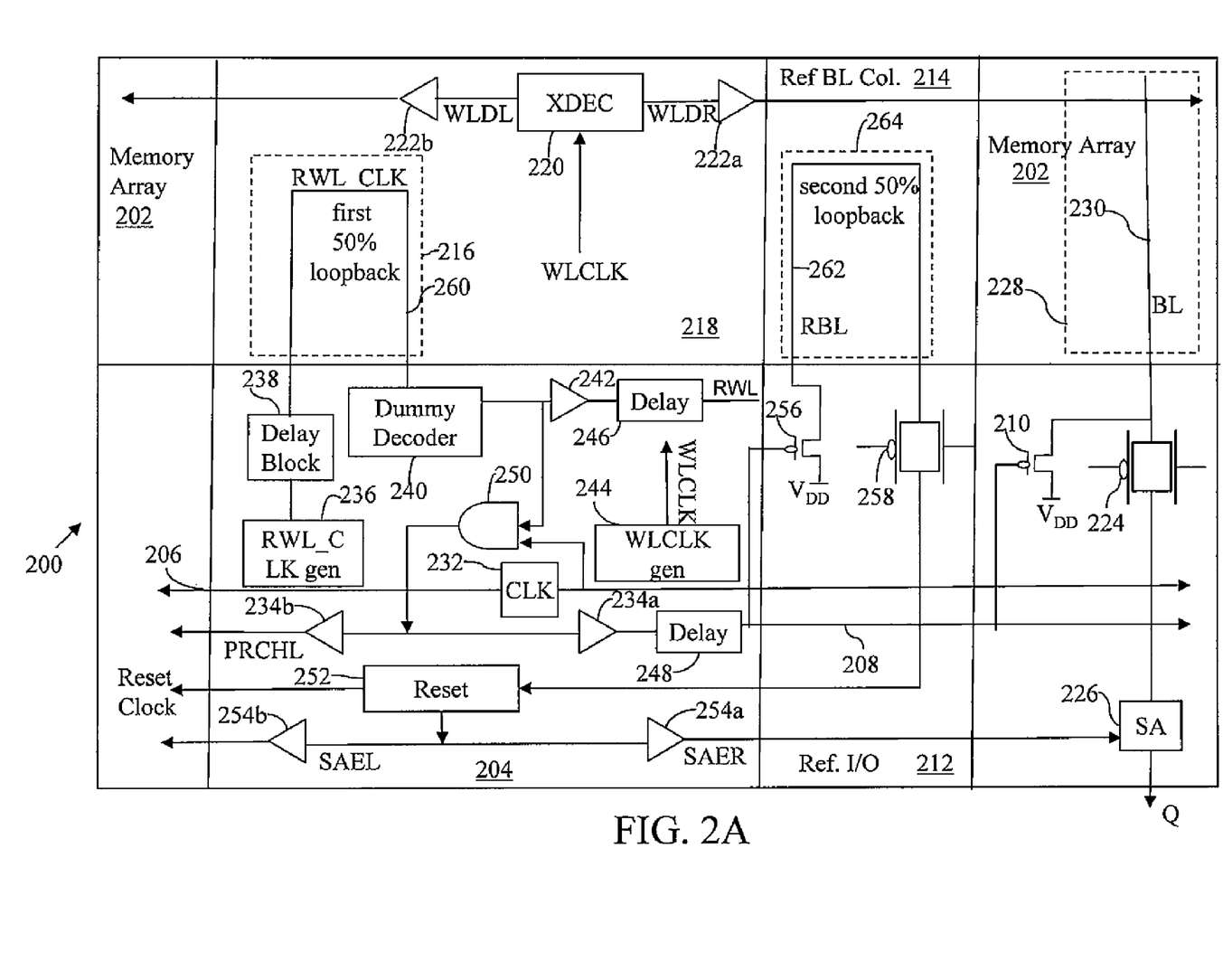
FIG. 2A is a block diagram of a memory device in accordance with an embodiment of the present invention.
Figure 2B:
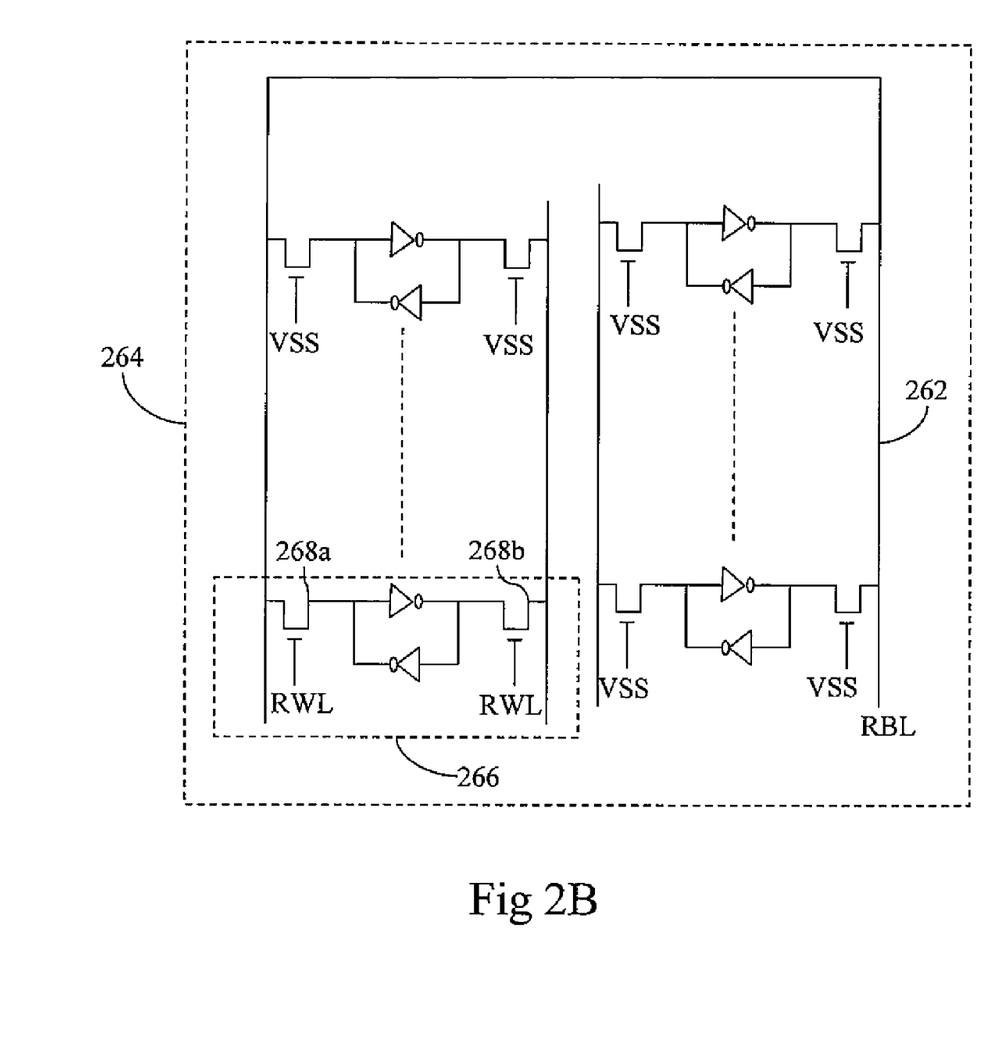
FIG. 2B is a circuit diagram of a loopback circuit of the memory device of FIG. 2A.

A memory device 200 in accordance with an embodiment of the present invention will now be described with reference to FIGS. 2A and 2B. FIG. 2A is block diagram of the memory device 200 and FIG. 2B is a circuit diagram of a loopback circuit of FIG. 2A. The memory device 200 includes a memory array 202, a control circuit 204, an internal clock line 206, a precharge line 208, a first PMOS transistor 210, a reference input/output (IO) 212, a Reference Bit Line Column (RBLC) 214, a Reference Word Line Column (RWLC) 216, an address decoder (XDEC) region 218, one or more XDECs 220, a Word Line Driver Right (WLDR) 222*a*, a Word Line Driver Left (WLDL) 222*b*, a first transmission gate 224, and a plurality of sense amplifiers 226, one of which is shown. The memory array 202 includes Dynamic Random Access Memory (DRAM), Static Random Access Memory (SRAM) and Read Only Memory (ROM).

The memory array 202 includes a plurality of bit line columns 228 (one of which is shown), which further includes a plurality of bit lines (BL) 230. The BL 230 is connected to a plurality of memory cells, which are further connected to a plurality of word lines (not shown). The plurality of memory cells can store logic 1 or logic 0.

The XDEC region 218 includes one or more of the XDECs 220, the WLDR 222a and the WLDL 222b. The control circuit 204 includes an internal clock generator 232, a Precharge Driver Right (PRCHR) 234a, a Precharge Driver Left (PRCHL) 234b, a Reference Word Line Clock (RWL_CLK) generator 236, a delay block 238, a dummy decoder 240, a Reference Word Line Driver (RWLD) 242, a Word Line Clock (WLCLK) generator 244, a first programmable delay circuit 246, a second programmable delay circuit 248, an AND gate 250, a reset block 252, a Sense Amplifier Enable Driver Right (SAER) 254a, and a Sense Amplifier Enable Driver Left (SAEL) 254b.

The internal clock of the memory device 200 is generated by the internal clock generator 232 on the internal clock line 206. The internal clock line 206 provides the internal clock signal to all the elements of the memory device 200. Read and write operations are performed in the memory device 200 when the internal clock is generated by the internal clock generator 232.

The reference IO 212 includes a second PMOS transistor 256 and a second transmission gate 258. The RWLC 216 includes a first predefined loopback such as a first fifty (50) percent loopback 260. In another embodiment of the present invention, the first predefined loopback is 25 percent loopback. The RBLC 214 includes a Reference Bit Line (RBL) 262 and a second predefined loopback such as a second fifty (50) percent loopback 264.

Referring now to FIG. 2B, the second fifty (50) percent loopback 264 includes a plurality of reference memory cells, which are preferably exact replicas of the plurality of memory cells 266. The memory cells 266 include a first pass gate 268a and a second pass gate 268b. The number of reference memory cells is equal to the number of the memory cells. It should be understood by a person ordinarily skilled in the art that first and second fifty (50) percent loopbacks are exemplary loopbacks. For example, in another embodiment of the invention, the loopbacks are 25% loopbacks.

In the standby mode of the memory device 200, the precharge signal on the precharge line 208 and the signal on the internal clock line 206 are low. The BL 230 and the RBL 262 are precharged to a first predefined threshold voltage. The first predefined threshold voltage is defined by a user, based on the voltage ($V_{DD}$) applied to the memory device 200, which generally lies in the range of about 90 to 98 percent of the applied voltage $V_{DD}$. Once a high signal is generated on the internal clock line 206, the WLCLK generator 244 and the RWL_CLK generator 236 simultaneously generate word line clock and reference word line clock, respectively, causing the dummy decoder 240 to generate a high output. The AND gate 250 receives the high output from the dummy decoder 240 along with the high signal on the internal clock line 206, and generates a high output signal that is provided to the precharge line 208. The high signal on the precharge line 208 is provided to the first and second PMOS transistors 210 and 256 by way of the precharge drivers 234a and 234b. The drain terminals of the PMOS transistors 210 and 256 are connected to the applied voltage ($V_{DD}$) line. The first and second PMOS transistors 210 and 256 switch off due to the high signal on the precharge line 208, which turns off the precharging of the BL 230 and the RBL 262.

The second programmable delay circuit 248, which is connected to the precharge line 208, enables a user to program a delay for the signal generated on the precharge line 208, which turns off the precharging of the BL 230 and the RBL 262 simultaneously. The programmed delay for the precharge signal enables compliance with six sigma variations.

Figure 3A:
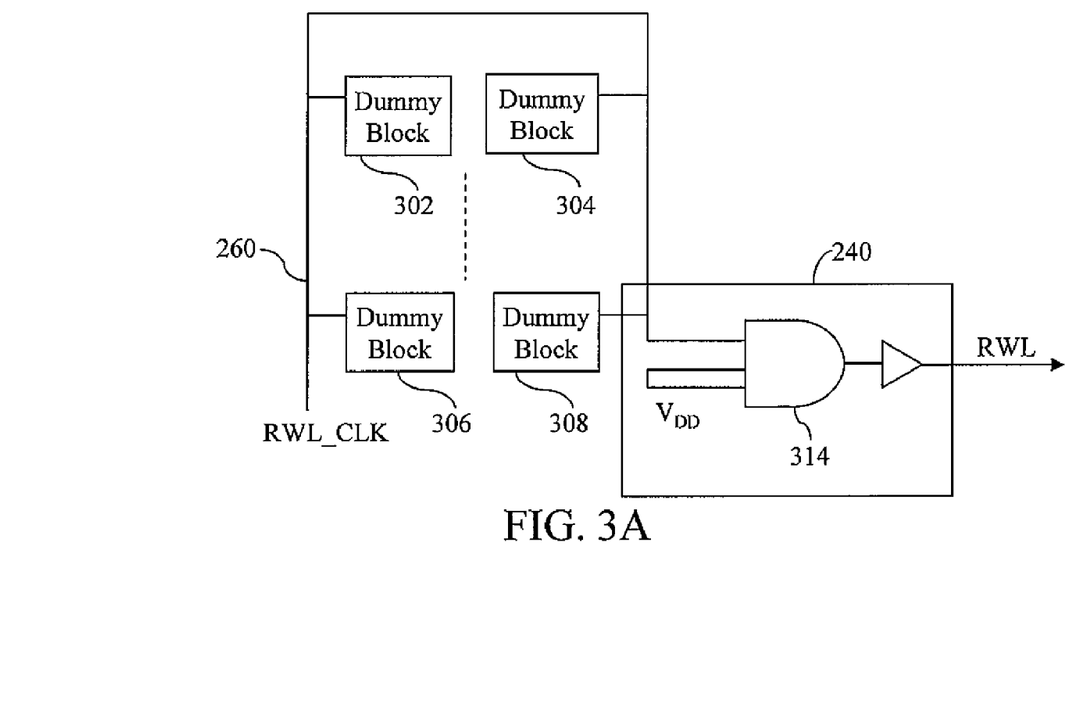
FIG. 3A is a block diagram of a first predefined loopback circuit in accordance with an embodiment of the present invention.

The delay block 238 is connected to the reference word line clock to allow compliance with six sigma variations. In accordance with delays in other signals, a delay is programmed in the delay block 238 by the user. The reference word line clock and the programmable delay ensure vertical tracking of the word line through the first fifty (50) percent loopback 260 of the RWL_CLK. Vertical tracking of the word line through the first fifty (50) percent loopback 260 will be explained in detail with reference to FIG. 3.

When the dummy decoder 240 receives the RWL_CLK, the dummy decoder 240 provides a signal to the RWLD 242, which generates a signal on a Reference Word Line (RWL). The RWLD 242 is connected to the first programmable delay circuit 246 to facilitate compliance with six sigma variations. In accordance with delays in other signals, a delay is programmed into the first programmable delay circuit 246 by the user. The signal generated on the RWL with a programmable delay through the first programmable delay circuit 246 is provided to the pass gates 268a and 268b of the reference memory cell 266, which initiates discharging of the RBL 262.

When the dummy decoder 240 generates a signal on the RWL, the XDEC 220 also simultaneously generates a signal on the plurality of the word lines to select one or more of the plurality of the word lines. This allows for vertical tracking of the plurality of word lines. It should be understood by a person of ordinary skill in the art that the bit line selection is also performed by the one or more address decoders. Each word line of the plurality of word lines selected by the XDEC 220 has a corresponding word line driver, e.g., the WLDR 222a and the WLDL 222b. The selected word line that corresponds to the WLDR 222a is enabled by the WLDR 222a.

When the RWL with a programmable delay is provided to the pass gates 268a and 268b of the reference memory cell 266, discharging of the RBL 262 is initiated. When the signal generated by the XDEC 220 reaches the farthest bit line column of the plurality of bit line columns, the corresponding bit line begins discharging. For example, when the signal generated by the XDEC 220 reaches the bit line column 228, the BL 230 starts discharging. There will be a delay in the signal generated on the RWL reaching the reference memory cell 266 and the signal generated by XDEC 220 reaching the bit line column 228. Therefore, there will be a corresponding delay in the initiation of discharging of the BL 230 and the RBL 262. When the BL 230 and the RBL 262 discharge to a second predefined threshold voltage, the second transmission gate 258 selects the RBL 262 and generates a signal that is provided to the reset block 252. The first transmission gate 224 also simultaneously selects the BL 230. The second predefined threshold voltage is defined as the voltage at which one or more inverters included in the sense amplifier 226 trip. In one embodiment of the present invention, the second predefined threshold voltage is $V_{ss}$, which generally lies in the range of about 5 to 50 percent of the applied voltage $V_{DD}$, depending on the configuration of the sense amplifier 226.

After receiving a signal from the second transmission gate 258, the reset block 252 generates a reset clock signal to pull down the internal clock. The reset block 252 also provides a signal to the SAER 254a and the SAEL 254b. The fan-out of the WLDR 222a is the same as the fan-out of the SAER 256a to ensure horizontal word line tracking. The same fan-out ensures that the signal generated by the WLDR 222a and the signal generated by the SAER 254a take the same amount of time to reach the farthest memory cell in the memory array 202. The same fan-out also ensures that there is no wastage of area in the memory device 200 because of the reference array 112, as discussed with reference to FIG. 1. As a result, the fabrication cost of the memory device 200 is lower than that of the conventional memory device 100. The SAER 254a and the SAEL 254b generate signals to enable the sense amplifier 226 to read the data (Q) from the BL 230.

Since there is a delay in the initiation of discharging of the BL 230 and the RBL 262, the fan-out of the WLDR 222a and the SAER 254a is made the same to ensure that the discharge time of the BL 230 and the RBL 262 is same. Therefore, accurate discharge tracking of the BL 230 is provided. In another embodiment of the present invention, the discharge tracking of the BL 230 is provided by implementing a column that is a replica of the memory cells without any loopback in the reference bit line column 214. In such embodiment, the second predefined loopback 264 is not required. When a read or write operation has been completed, the internal clock signal on the internal clock line 206 goes low. The precharge signal on the precharge line 208 also goes low, which enables precharging of the BL 230 and the RBL 262 by way of the PRCHR 234a and the PRCHL 234b. In yet another embodiment of the present invention, the write operation can also be performed in the same clock cycle of the read operation.

Referring now to FIG. 3A, which illustrates the first fifty (50) percent loopback 260 that is included in the XDEC region 218, in accordance with an embodiment of the present invention. The first fifty (50) percent loopback 260 includes a plurality of dummy blocks such as a dummy blocks 302-308. The plurality of dummy blocks 302-308 included in the first fifty (50) percent loopback 260 is equal to the number of the one or more XDECs 220 in the XDEC region 218. As shown in FIG. 2A, the reference word line clock generated by the RWL_CLK generator 236 is provided to the first fifty (50) percent loopback 260 for vertical tracking of the word line.

The WLCLK generator 244 generates the WLCLK at the same time as the RWL_CLK is generated by the RWL_CLK generator 236. The WLCLK is provided to the one or more XDECs 220. Therefore, an equal number of the plurality of dummy blocks 302-308 and the one or more XDECs 220 ensure that the load on RWL_CLK is the same as that on WLCLK. An equal load contributes to the same or similar delay in the signals generated on the RWL_CLK and the WLCLK. Further, the delay block 238 enables a user to program the delay in the RWL_CLK to facilitate compliance with six sigma variations.

Figure 3B:
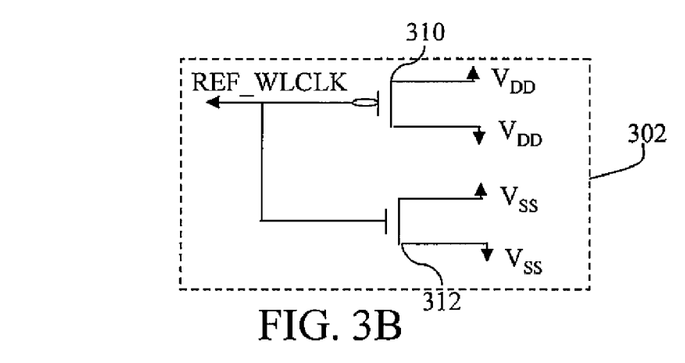
FIG. 3B is a circuit diagram of a dummy block of the first predefined loopback circuit of FIG. 3A.

Referring now to FIG. 3B, the dummy block 302 includes a PMOS transistor 310 and an NMOS transistor 312. The gate terminals of the PMOS transistor 310 and the NMOS transistor 312 are connected to the RWL_CLK line. The source and drain terminals of the PMOS transistor 310 are connected to the supply voltage ($V_{DD}$), whereas the source and drain terminals of the NMOS transistor 312 are connected to the second predefined voltage ($V_{SS}$). The same signal on the source and drain terminals of the PMOS transistor 310 and the NMOS transistor 312 ensures that both the transistors act as capacitive blocks. An equal number of the plurality of dummy blocks 302-308 and the one or more XDECs 220 ensure that the RWL_CLK line and the WLCLK line have the same capacitive path, which further ensures that there is little to no time delay between the signals generated on the RWL_CLK line and the WLCLK line.

When a signal is generated on the RWL_CLK line by the RWL_CLK generator 236, gate terminals of the plurality of dummy blocks 302-308 are enabled. The time taken by the signal on the RWL-CLK line to reach the dummy decoder 240 should be the same as the time taken by the WLCLK signal generated by the WLCLK generator 244 to reach the XDEC 220. Delays are programmed using the delay block 238. This ensures vertical word line tracking. The dummy decoder 240 further includes an AND gate 314 and a combination of other logic gates. It should be understood by a person of ordinary skill in the art that the dummy decoder 240 can be implemented by any other combination of logic gates. The RWL_CLK is provided as an input to the AND gate 314. The other two input lines are connected to the supply voltage $V_{DD}$. In another embodiment of the invention, the other two input lines can be clocked pre-decoded lines. It should be understood by a person of ordinary skill in the art that the AND gate 314 can be implemented with more than three inputs.

In another embodiment of the present invention, when the control circuit 204 is critical and requires more area in the memory device 200, the first fifty (50) percent loopback 260 is not included. In this embodiment, the vertical tracking of the word line is provided by the fan-out of the RWL_CLK, which is the same as the fan-out of WLCLK. This allows for the same delay between the signal on the WLCLK line at the XDEC 220 and the signal on the RWL_CLK at the dummy decoder 240. Same fan-out drivers have the same delay when the signal path is capacitive. Therefore, to ensure the same fan-out, wide metal lines are used for the WLCLK line and the RWL_CLK line to reduce resistance. The use of wide metal lines allows the WLCLK signal and the RWL_CLK signal to be routed to one or more XDECs 220 and the dummy decoder 240.

Figure 4:
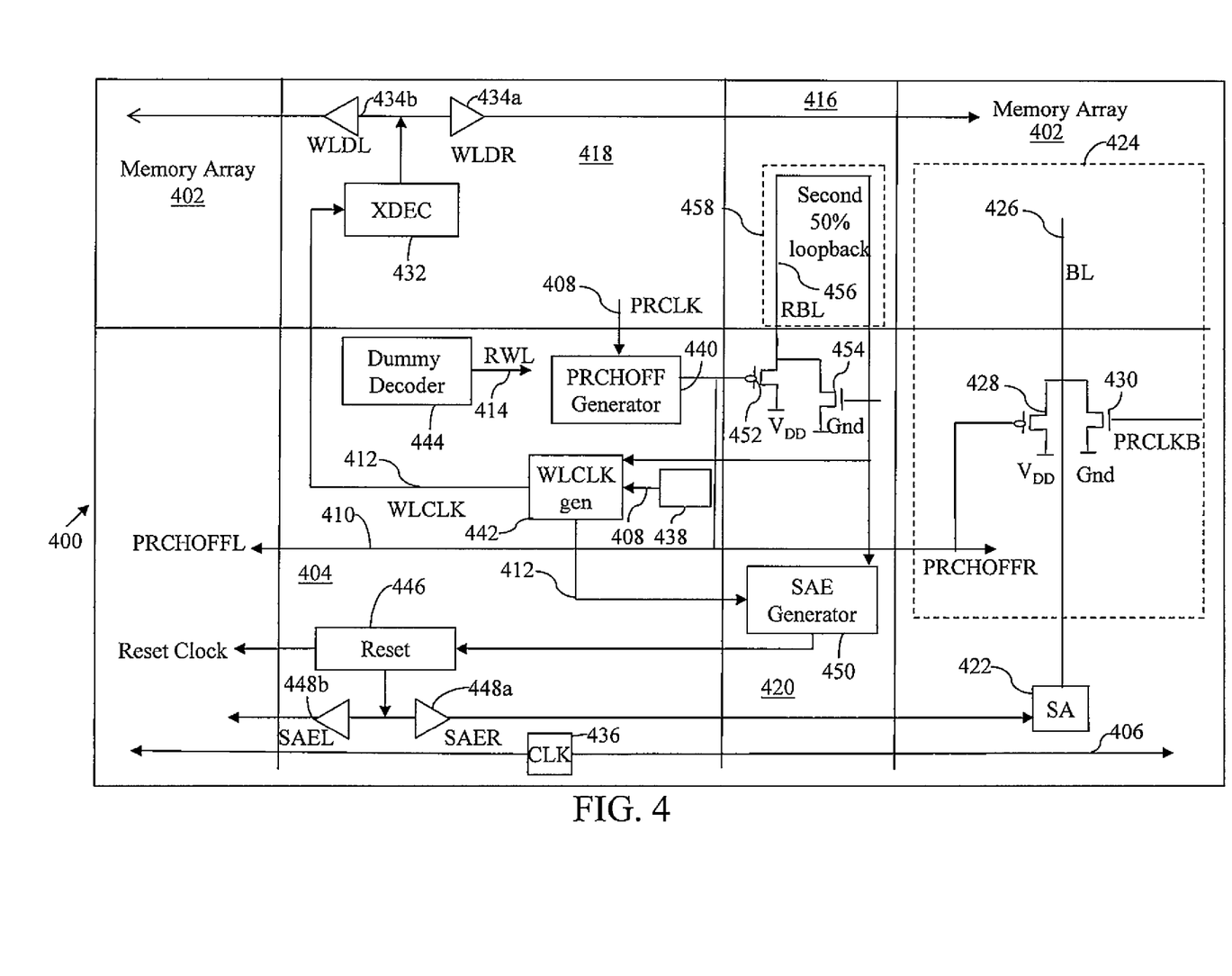
FIG. 4 is a block diagram of a zero-leakage Read Only Memory (ROM) device in accordance with an embodiment of the present invention.

Referring now to FIG. 4, a circuit diagram of a zero leakage read only memory (ROM) device 400 in accordance with an embodiment of the present invention is shown. The zero leakage ROM device 400 includes a memory array 402, a control circuit 404, an internal clock line 406, a Precharge Clock (PRCLK) line 408, a precharge off line 410, a word line clock (WLCLK) line 412, a Reference Word Line (RWL) 414, a Reference Bit Line Column (RBLC) 416, an address decoder (XDEC) region 418, a reference input/output (IO) 420, a plurality of sense amplifiers such as a sense amplifier 422, and the RWLC 216 (see FIG. 2A). The RWLC 216 further includes the first fifty (50) percent loopback 260 shown in FIG. 2A.

The memory array 402 includes a plurality of bit line columns, such as a Bit Line (BL) column 424, which further includes a plurality of bit lines such as a BL 426. The memory array 402 also includes a first PMOS transistor 428 and a first NMOS transistor 430. The BL 426 is connected to a plurality of memory cells that are further connected to a plurality of word lines (not shown). The memory cells can store logic 1 or logic 0. The drain terminal of the memory cell is connected to the BL 426. When the memory cell stores logic '1', the source terminal of the memory cell is open-circuited, and when the memory cell stores logic '0', the source terminal of the memory cell is connected to a source line, which is at ground voltage. Further details relating to the memory cells and the source line are explained with reference to FIG. 6.

The first PMOS transistor 428 and the first NMOS transistor 430 are used to precharge and discharge the BL 426. The source terminals of both transistors 428 and 430 are connected to the BL 426. The gate terminal of the first PMOS transistor 428 is connected to the precharge off line 410 and receives the PRCHOFFR signal and the gate terminal of the first NMOS transistor 430 is connected to an inverted precharge off line 410 and receives the PRCLKB signal. The drain terminals of the first PMOS transistor 428 and the first NMOS transistor 430 are connected to the supply voltage of the zero leakage ROM device 400 and ground, respectively.

The XDEC region 418 includes one or more XDECs such as an XDEC 432, a Word Line Driver Right (WLDR) 434a, and a Word Line Driver Left (WLDL) 434b. The control circuit 404 further includes an internal clock generator 436, a precharge generator 438, a precharge off generator 440, a word line clock (WLCLK) generator 442, a dummy decoder 444, a reset block 446, a sense amplifier enable right (SAER) 448a, and a sense amplifier enable left (SAEL) 448b. The internal clock is generated by the internal clock generator 436 on the internal clock line 406. The internal clock line 406 provides the internal clock signal to all of the elements of the zero leakage ROM device 400. The read and write operations are performed when the internal clock is generated by the internal clock generator 436.

The reference IO 420 comprises a Sense Amplifier Enable (SAE) generator 450, a second PMOS transistor 452, and a second NMOS transistor 454. The RBLC 416 comprises a reference bit line (RBL) 456 and a second predefined loopback such as a second fifty (50) percent loopback 458 of the RBL 456. In another embodiment of the present invention, the second predefined loopback is 25 percent loopback. It should be understood by a person of ordinary skill in the art that the second fifty (50) percent loopback is an exemplary loopback and can be implemented with reference to any other embodiment of the present invention. The second PMOS transistor 452 and the second NMOS transistor 454 are used to precharge and discharge the RBL 456. The source terminals of the transistors 452 and 454 are connected to the RBL 456; the gate terminals are connected to the precharge off line 410 and the inverted PRCLK line 408, respectively; and the drain terminals are connected to the supply voltage and ground, respectively.

In the standby mode, the BL 426 is low and the precharge off line 410 is high. Before the read operation, the BL 426 and the RBL 456 are precharged to allow for read '0' and '1' operations. To initiate precharging of the BL 426 and the RBL 456, the precharge generator 438 generates a signal on the PRCLK line 408, which is provided to the precharge off generator 440. The precharge off generator 440 then generates a signal on the precharge off line 410 to pull it down, which starts precharging of the BL 426 and the RBL 456. Further details of the architecture and operation of the precharge off generator 440 are explained with reference to FIG. 6.

The BL 426 and the RBL 456 are precharged to a first predefined threshold voltage, which is defined by a user, based on the voltage ($V_{DD}$) applied to the zero leakage ROM device 400. The first predefined threshold voltage generally lies in the range of about 90 to 98 percent of the applied voltage $V_{DD}$. The BL 426 is precharged using a combination of the first PMOS transistor 428 and the first NMOS transistor 430. In contrast, the RBL 456 is precharged using a combination of the second PMOS transistor 452 and the second NMOS transistor 454. Further details relating to the precharging of the BL 426 and the RBL 456 are provided below with reference to FIG. 6.

Figure 5A:
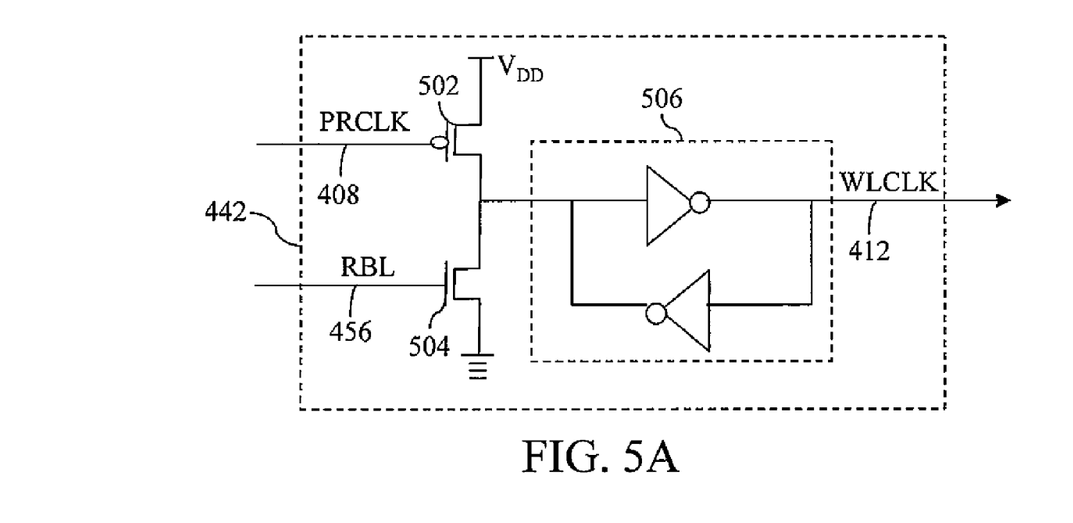
FIG. 5A is a circuit diagram of a word line clock generator in accordance with an embodiment of the present invention.

When the BL 426 and the RBL 456 are precharged to the first predefined voltage, the WLCLK generator 442 generates a signal on the WLCLK line 412, which is provided to the XDEC 432. The signals provided to the WLCLK generator 442, to generate the signal on the WLCLK line 412 are shown in FIG. 5A. When the WLCLK generator 442 generates a signal on the WLCLK line 412, vertical word line tracking is provided by the RWL_CLK generator 236, the delay block 238 and the first fifty (50) percent loopback 260 of the RWL_CLK, as explained above with respect to FIG. 2A and FIG. 3.

When the XDEC 432 receives the WLCLK signal, the delay block 238 ensures that the dummy decoder 444 receives the RWL_CLK at the same time via the first fifty (50) percent loopback 260. Thereafter, the XDEC 432 generates a signal on the plurality of word lines to simultaneously select one or more of the plurality of word lines when the dummy decoder 444 generates a signal on the RWL 414. The programmable delay associated with the RWL 414 is explained in detail with respect to FIG. 5B. Each word line of the plurality of word lines has a corresponding word line driver such as the WLDR 434a and the WLDL 434b. The selected word line corresponding to the WLDR 434a is enabled by the WLDR 434a. When the signals generated by the dummy decoder 444 and the XDEC 432, respectively, reach the RBLC 416 and the farthest memory cell in the memory array 402 respectively, discharging of the BL 426 and the RBL 456 is initiated. There will be a delay in the signal reaching the RBLC 416 and the farthest memory cell being generated by the dummy decoder 444 and the XDEC 432 respectively. Precharge and discharge tracking of the BL 426 is ensured by the second fifty (50) percent loopback 458. The architecture of the second fifty (50) percent loopback 458 is explained in detail with respect to FIG. 6.

When the BL 426 and the RBL 456 are discharged to the second predefined threshold voltage, a signal is provided to the SAE generator 450. The second predefined threshold voltage is defined as the voltage at which one or more invertors included in the sense amplifier 422 trip. In an embodiment of the present invention, the second predefined threshold voltage is $V_{ss}$, which generally lies in the range of about 5 to fifty (50) percent of the applied voltage $V_{DD}$, depending on the configuration of the sense amplifier 422.

The SAE generator 450 generates a signal that is provided to the reset block 446. Thereafter, the reset block 446 provides a signal to the SAER 448a and the SAEL 448b. The SAER 448a generates a signal to enable the sense amplifier 422 to read the data from the BL 426. The fan-out of the WLDR 434a is the same as the fan-out of the SAER 448a, to allow horizontal word line tracking. The same fan-out ensures that the signals generated by the WLDR 434a and the SAER 448a, respectively, take about the same time to reach the farthest memory cell in the memory array 402. As a result, there is no time delay between the two signals.

The reset block 446 generates a reset clock, which pulls down the signals on the internal clock line 406 and the PRCLK line 408, respectively. A low signal on the PRCLK line 408 results in a high signal on the inverted PRCLK line 408. The inverted PRCLK line 408 is provided to the gate terminals of the first NMOS transistor 430 and the second NMOS transistor 454, which results in the BL 426 and the RBL 456 being discharged. Therefore, the zero leakage ROM device 400 returns to the standby mode. The low signal on the BL 426 and the RBL 456 ensures zero leakage. Since there is delay in the initiation of discharging of the BL 426 and the RBL 456, fan-out of the WLDR 434a and the SAER 448a is the same, to ensure that the discharge time of the BL 426 and the RBL 456 is same. Therefore, accurate discharge tracking of the BL 426 is enabled. In another embodiment of the present invention, the discharge tracking of the BL 426 can be ensured by implementing a column that is a replica of the memory cells without any loopback. In this embodiment, the second predefined loopback is not required.

Referring now to FIG. 5A, a circuit diagram of the WLCLK generator 442 in accordance with an embodiment of the present invention is shown. The WLCLK generator 442 further includes a PMOS transistor 502, an NMOS transistor 504, and an inverter circuit 506. The inverter circuit 506 includes two inverters that are cross-connected to each other. The gate terminals of the PMOS transistor 502 and the NMOS transistors are connected to the PRCLK line 408 and the RBL 456, respectively. The drain terminal of the PMOS transistor 502 is connected to the supply voltage ($V_{DD}$), and the source terminal is connected to the drain terminal of the NMOS transistor 504. The source terminal of the NMOS transistor is grounded. An input is provided to the inverter circuit 506 from the source terminal of the PMOS transistor 502 and the drain terminal of the NMOS transistor. It should be understood by a person of ordinary skill in the art that the WLCLK generator 442 can also be implemented by other combinations of logic gates.

In the standby mode, the RBL 456 and the PRCLK line 408 are low. Therefore, the PMOS transistor 502 is switched on and the NMOS transistor is switched off. This results in a low signal at the WLCLK line 412. Once the PRCLK line 408 is enabled to initiate the read operation, the PMOS transistor 502 is switched off and the low signal at the WLCLK line 412 is preserved by the inverter circuit 506. Enabling the PRCLK line 408 results in precharging of the RBL 456. Once the RBL 456 is precharged to the first predefined threshold voltage, the NMOS transistor 504 is switched on and the WLCLK line 412 becomes high.

When a read or write operation is executed, the reset clock generated by the reset block 446 pulls down the PRCLK line 408, which results in discharging of the RBL 456. Therefore, the zero leakage ROM device returns to the standby mode and the WLCLK line 412 is disabled.

Figure 5B:
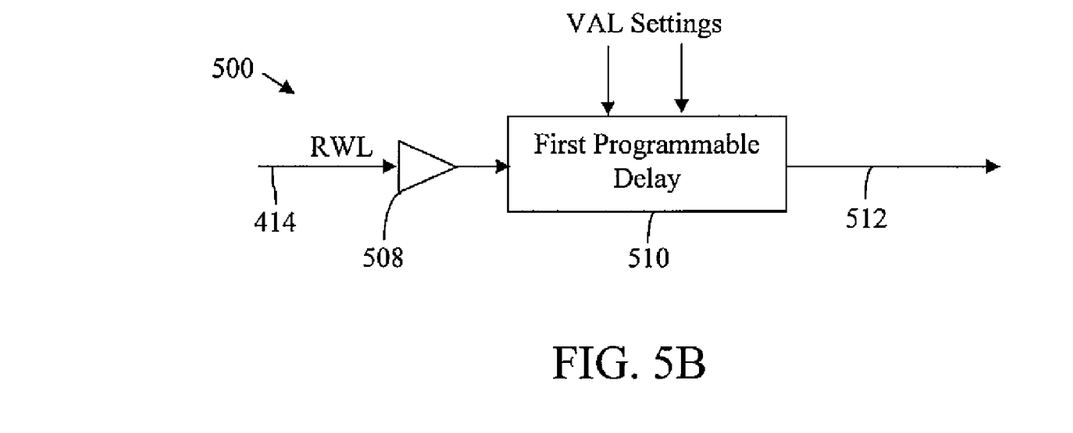
FIG. 5B is a block diagram of a reference word line with delay generation circuit in accordance with an embodiment of the present invention.

Referring now to FIG. 5B, a block diagram of a circuit 500 illustrating the generation of RWL with a delay in accordance with an embodiment of the present invention is shown. The circuit 500 includes a reference word line driver (RWLD) 508 and a first programmable delay circuit 510. The signal generated by the dummy decoder 444 on the RWL 414 is provided to the RWLD 508, which enables the RWL 414. The first programmable delay circuit 510 is connected to the RWL 414 to facilitate compliance with six sigma variations. The first programmable delay circuit 510 is also provided with VAL settings, which also facilitates compliance with six sigma variations. The first programmable delay circuit 510 enables the user to program a delay to ensure that there is no delay between the word line signal and the RWL signal. Therefore, a reference word line signal with delay 512 is generated by the first programmable delay circuit 510.

Figure 6:
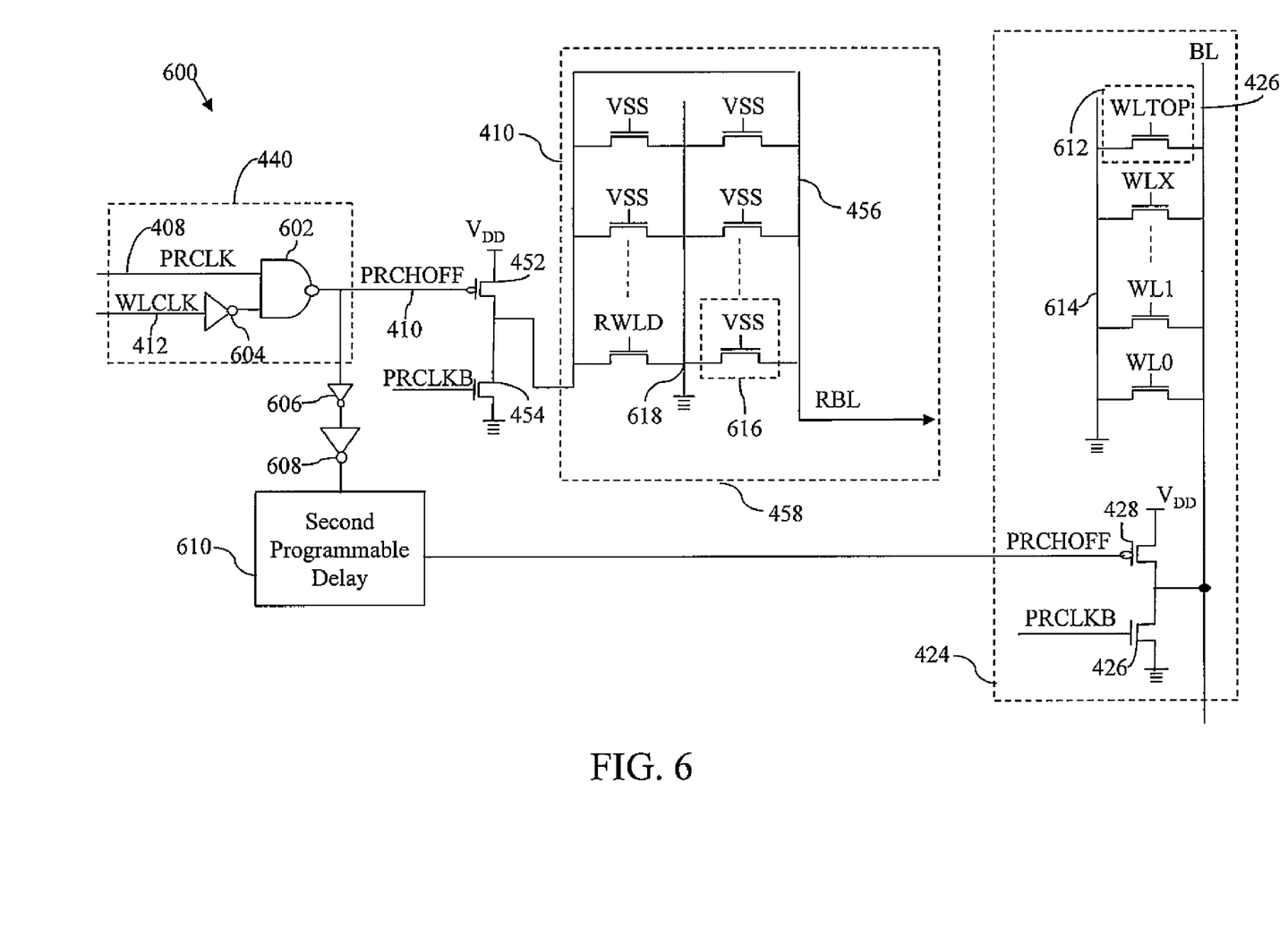
FIG. 6 is a circuit diagram of a precharge off generator, a first predefined loopback, and a bit line column, in accordance with another embodiment of the present invention.

Referring now to FIG. 6, circuit diagram 600 of the precharge off generator 440, the first fifty (50) percent loopback 458 and the BL column 424 in accordance with an embodiment of the present invention is shown. The precharge off generator 440 includes a NAND gate 602 and an inverter 604. The WLCLK line 412 is provided as an input to the inverter 604. The output of the inverter 604 and the PRCLK line 408 are provided to the NAND gate 602. It will be understood by a person of ordinary skill in the art that the precharge off generator 440 can also be implemented using other combinations of logic gates. The control circuit 404 includes a first inverter 606, a second inverter 608, and a second programmable delay circuit 610. The BL column 424 comprises one or more memory cells such as a memory cell 612 and a source line 614. The second fifty (50) percent loopback 458 comprises a plurality of reference memory cells such as a reference memory cell 616 and a reference source line 618. The number of reference memory cells is equal to the number of memory cells in the BL column 424.

In the standby mode, the BL 426, the source line 614, the reference source line 618 and the WLCLK line 412 are low. However, the precharge off line 410 is high. Before the read operation, the BL 426 and the RBL 456 are precharged to enable read '0' and '1' operations. The precharge generator 438 generates a signal on the PRCLK line 408 to initiate precharging of the BL 426 and the RBL 456. The high signal generated on the PRCLK line 408 results in the precharge off line 410 being pulled down. The first PMOS transistor 428 and the second PMOS transistor 452 are switched on by the low signal on the precharge off line 410. The first inverter 606 and the second inverter 608 are connected to the precharge off line 410 to refine the signal generated on the precharge off line 410. The second inverter 608 is larger in size than the first inverter 606 to drive a large load on the precharge off line 410.

The second programmable delay circuit 610 enables a user to program a delay on the precharge off line 410 so that the first PMOS transistor 428 and the second PMOS transistor 452 are switched on simultaneously. The programmed delay allows compliance with six sigma variations. The BL 426 and the RBL 456 are therefore precharged by the first PMOS transistor 428 and the second PMOS transistor 452, respectively. The second fifty (50) percent loopback 458 includes one or more reference memory cells, which are a replica of the one or more memory cells of the BL column 424 to allow accurate precharge tracking of the BL 426. For example, the reference memory cell 616 is preferably an exact replica of the memory cell 612. When the BL 426 and the RBL 456 are precharged to the first predefined voltage, the WLCLK generator 442 generates a signal on the WLCLK line 412, which is provided to the XDEC 432. The signals provided to the WLCLK generator 442 to generate the signal on the WLCLK line 412 are explained in detail with respect to FIG. 5A. When the signal on the WLCLK line 412 is provided to the precharge off generator 440, the precharge off generator 440 generates a high signal on the precharge off line 410. The high signal on the precharge off line 410 turns off the first PMOS transistor 428 and the second PMOS transistor 452 substantially simultaneously using the second programmable delay circuit 610, which stops the precharging of the BL 426 and the RBL 456.

When the XDEC 432 receives the WLCLK signal, the delay block 240 ensures that the dummy decoder 444 receives the RWL_CLK simultaneously via the first fifty (50) percent loopback 262. Thereafter, the XDEC 432 generates a signal on the plurality of word lines to simultaneously select one or more of the plurality of the word lines when the dummy decoder 444 generates a signal on the RWL 414. Each word line has a corresponding word line driver such as the WLDR 434a and the WLDL 434b. The selected word line corresponding to the WLDR 434a is enabled by the WLDR 434a. When the signals generated by the dummy decoder 444 and the XDEC 432, respectively, delay in reaching the reference memory cell 616 and the memory cell 612, respectively, discharging of the BL 426 and the RBL are initiated. When the BL 426 and the RBL 456 are discharged to the second predefined threshold voltage, a signal is provided to the SAE generator 450. The operation of the SAE generator 450 is explained with reference to FIG. 7. Precharge and discharge tracking of the BL 426 is provided for by the second fifty (50) percent loopback 458. Tracking by the same loopback reduces the area required to track the precharge and discharge of the BL 426 by separate circuits.

The SAE generator 450 generates a signal that is provided to the reset block 446. The reset block 446 provides a signal to the SAER 448*a* and the SAEL 448*b*, which generate a signal to enable the sense amplifier 422 to read the data from the BL 426. Further, the reset block 446 generates a reset clock, which pulls down the signals on the internal clock line 406 and the PRCLK line 408, respectively. The low signal on the PRCLK line 408 results in a high signal on the invert of the PRCLK line 408. The invert of the PRCLK line 408 is provided to the gate terminals of the first and second NMOS transistors 430 and 454, which results in complete discharging of the BL 426 and the RBL 456. Therefore, the zero leakage ROM device 400 returns to the standby mode. The low signals on the BL 426 and the RBL 456 ensure zero leakage.

Figure 7:
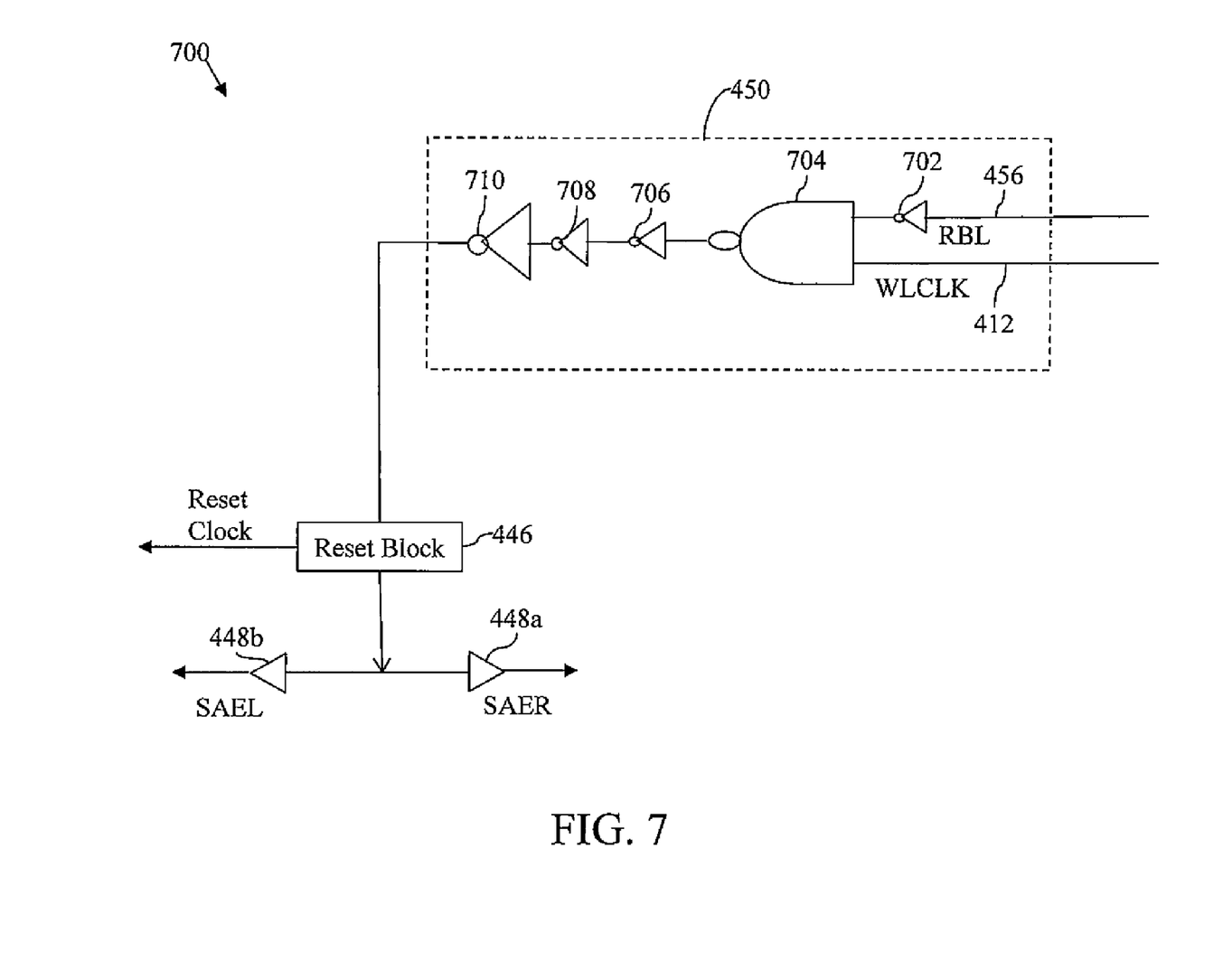
FIG. 7 is a circuit diagram of a sense amplifier generator in accordance with an embodiment of the present invention.

Referring now to FIG. 7, a circuit diagram or a circuit 700 of the SAE generator 450 in accordance with an embodiment of the present invention is shown. The SAE generator 450 includes a first inverter 702, a NAND gate 704, a second inverter 706, a third inverter 708, and a fourth inverter 710. The first inverter 702 is connected to the RBL 456 and the output of the first inverter 702 is provided to the NAND gate 704. The output of the SAE generator 450 is provided to the SAER 448*a* and the SAEL 448*b* by way of the reset block 446. The WLCLK line 412 is also input to the NAND gate 704 to ensure that there is no toggling of the output from the SAER 448*a* and the SAEL 448*b* with the RBL 456. By avoiding toggling, active power is saved because the SAER 448*a* and the SAER 448*b* drive highly capacitive lines.

The output of the NAND gate 704 is provided to the second inverter 706. The second inverter 706, the third inverter 708 and the fourth inverter 710 are connected in series to refine the output generated by the NAND gate 704. The fourth inverter 710 is preferably larger in size than the third inverter 708, which is in turn larger in size than the second inverter 706. The size variation in the three inverters ensures that the fourth inverter 710 derives the maximum load on the output line of the NAND gate 704. It will be understood by those of ordinary skill in the art that the SAE generator 450 can also be implemented using other combinations of logic gates.

In the standby mode, there is no signal on the WLCLK line 412 and the RBL 456. When the PRCLK line 408 is enabled by the precharge generator 438, precharging of the RBL 456 is initiated. When the RBL 456 is precharged to the first predefined threshold voltage, the WLCLK generator 442 generates a signal on the WLCLK line 412. The first inverter 702 when connected to the RBL 456 ensures a logic '1' output from the NAND gate 704 and a logic '0' output from the fourth inverter 710. Therefore, the output from the SAE generator 450 is at logic '0' at this stage.

When the signal is generated on the WLCLK line 412 by the WLCLK generator 442, precharging of the RBL 456 is stopped, as explained above. Discharging of the RBL 456 is initiated when the signal generated by the dummy decoder 444 reaches the reference memory cell 616. When the RBL 456 is discharged to the second predefined threshold voltage, the RBL 456 is pulled down to logic '0'. The first inverter 702 ensures that logic '1' is provided to the NAND gate 704. The high signal on the WLCLK line 412 ensures logic '0' as output from the NAND gate 704. Further, the second inverter 706, the third inverter 708 and the fourth inverter 710 ensure that logic '1' is output from the SAE generator 450. The output of the SAE generator 450 is provided to the reset block 446, which provides a signal to the SAER 448*a* and the SAEL 448*b*. Further, the reset block 446 generates a reset clock, which pulls down the signals on the internal clock line 406 and the signal on the PRCLK line 408, respectively.

Figure 8:
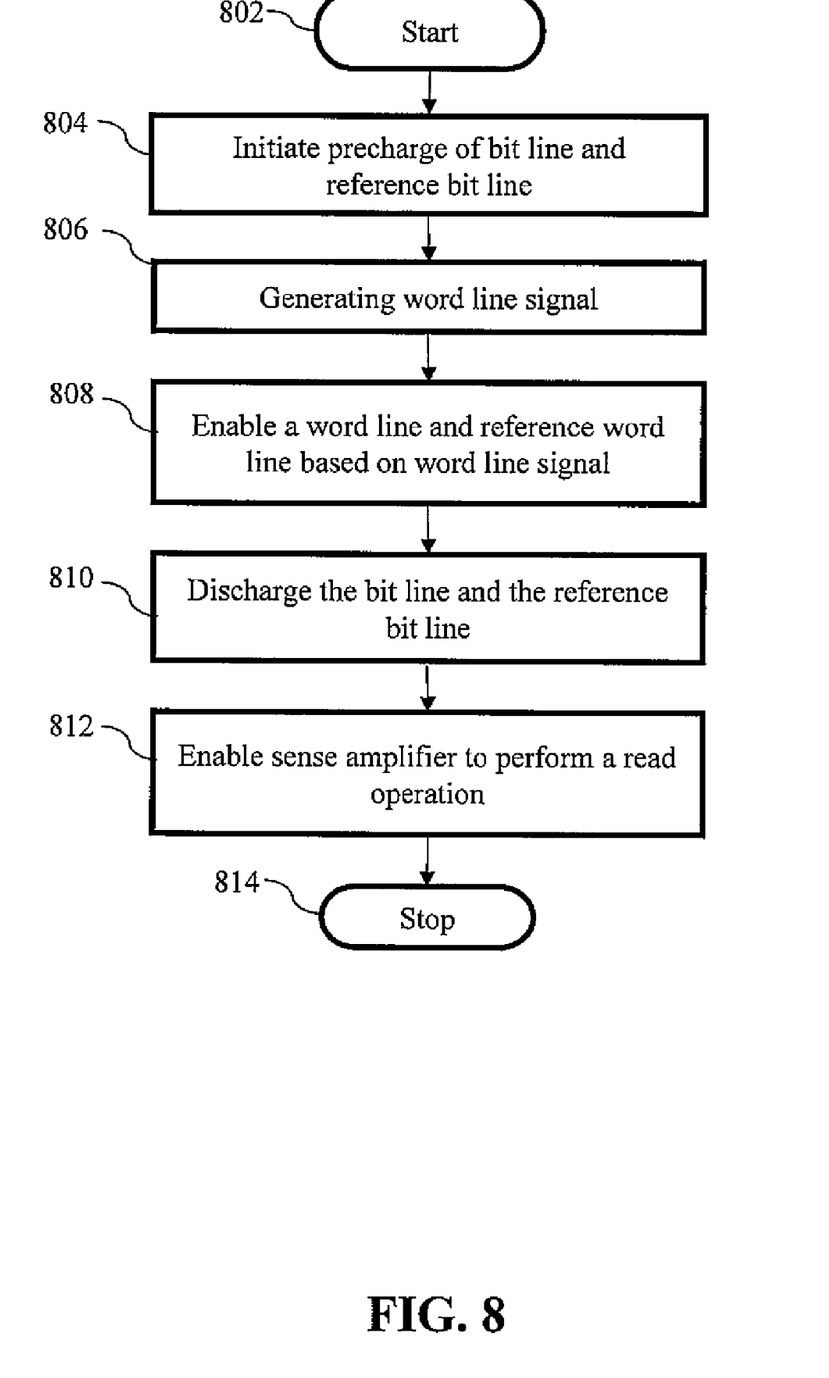
FIG. 8 is a flow chart of a method for performing a read operation in the zero leakage ROM in accordance with an embodiment of the present invention.

Referring now to FIG. 8, a flow chart illustrating a method for performing a read operation in the zero leakage ROM device 400 in accordance with an embodiment of the present invention is shown.

The method is initiated at step 802. In the standby mode, the BL 426 is low and the precharge off line 410 is high. At step 804, precharging of the BL 426 and the RBL 456 is initiated to enable read '0' and '1' operations. The precharge generator 438 generates a signal on the PRCLK line 408, which is provided to the precharge off generator 440. The precharge off generator 440 then generates a signal on the precharge off line 410 to pull the precharge off line 410 down, which starts precharging of the BL 426 and the RBL 456. The BL 426 and the RBL 456 are precharged to the first predefined threshold voltage. The BL 426 is precharged using the first PMOS transistor 428. In contrast, the RBL 456 is precharged using the second PMOS transistor 452. When the BL 426 and the RBL 456 are precharged to the first predefined threshold voltage, the WLCLK generator 442 generates a signal on the WLCLK line 412, which is provided to the XDEC 432. The signals provided to the WLCLK generator 442 to generate the signal on the WLCLK line 412 are explained in detail with respect to FIG. 5A. When the WLCLK generator 442 generates a signal on the WLCLK line 412, vertical word line tracking is provided by the RWL_CLK generator 236, the delay block 238 and the first fifty (50) percent loopback 260 of the RWL_CLK, as explained with respect to FIGS. 2 and 3. When the XDEC 432 receives the WLCLK signal, the delay block 238 ensures that the dummy decoder 444 substantially simultaneously receives the RWL_CLK via the first fifty (50) percent loopback 260.

At step 806, the XDEC 432 generates a signal on the plurality of word lines to substantially simultaneously select one or more of the plurality of the word lines when the dummy decoder 444 generates a signal on the RWL 414. Each word line has a corresponding word line driver such as the WLDR 434*a* and the WLDL 434*b*. At step 808, the selected word line corresponding to the WLDR 434*a* is enabled by the WLDR 434*a*. At step 810, discharging of the BL 426 and the RBL 456 are initiated, when the signal generated by the dummy decoder 444 and the XDEC 432 reach the RBLC 416 and the farthest memory cell in the memory array 402, respectively. There will be a delay in the signal reaching the RBLC 416 and the farthest memory cell being generated by the dummy decoder 444 and the XDEC 432, respectively. Precharge and discharge tracking of the BL 426 and the RBL 456 are accomplished by the second fifty (50) percent loopback 458. When the BL 426 and the RBL 456 are discharged to the second predefined threshold voltage, a signal is provided to the SAE generator 450. The second predefined threshold voltage is defined as the voltage at which one or more invertors included in the sense amplifier 422 trip. In one embodiment of the present invention, the second predefined threshold voltage is $V_{ss}$, which is approximately zero.

The SAE generator 450 generates a signal that is provided to the reset block 446. Thereafter, the reset block 446 provides a signal to the SAER 448*a* and the SAEL 448*b*. At step 812, the SAER 448*a* generates a signal to enable the sense amplifier 422 to read the data from the BL 426. Fan-out of the WLDR 434*a* is the same as fan-out of the SAER 448*a* to allow accurate horizontal word line tracking. The same fan-out also ensures that the signals generated by the WLDR 434*a* and the SAER 448*a* take substantially the same time to reach the farthest memory cell in the memory array 402. Therefore, there is no time delay between the two signals.

The reset block 446 also generates a reset clock, which pulls down the signals on the internal clock line 406 and the PRCLK line 408, respectively. The low signal on the PRCLK line 408 results in a high signal on the invert of the PRCLK line 408. The invert of the PRCLK line 408 is provided to the gate terminals of the first NMOS transistor 430 and the second NMOS transistor 454, which results in complete discharge of the BL 426 and the RBL 456. Therefore, the zero leakage ROM device 400 returns to the standby mode. The low signal on the BL 426 and the RBL 456 facilitate zero leakage. Since there is delay in the initiation of discharging of the BL 426 and the RBL 456, fan-out of the WLDR 434a and the SAER 448a is the same so that the discharge time of the BL 426 and the RBL 456 is same. Therefore, accurate discharge tracking of the BL 426 is provided. In another embodiment of the present invention, the discharge tracking of the BL 426 is provided by implementing a column of exact replica of memory cells without any loopback. In this embodiment, the second predefined loopback is not required. Thereafter, the method terminates at step 814.

While various embodiments of the present invention have been illustrated and described, it will be clear that the present invention is not limited only to these embodiments. Numerous modifications, changes, variations, substitutions, and equivalents will be apparent to those skilled in the art, without departing from the spirit and scope of the present invention, as described in the claims.

The invention claimed is:

1. A zero leakage read only memory (ROM) including a memory array, the memory array comprising a plurality of bit line columns connected to a plurality of bit lines, each of the plurality of bit line columns comprising a plurality of memory cells, wherein each of the plurality of memory cells are connected to a plurality of word lines, comprising:
   one or more address decoders for selecting at least one of the plurality of bit lines and word lines;
   a plurality of sense amplifiers for sensing the plurality of bit lines, wherein each of the plurality of sense amplifiers is associated with a corresponding bit line of the plurality of bit lines;
   a reference word line column for vertical tracking of the at least one of the plurality of word lines using a first predefined loopback;
   a reference bit line column comprising a reference bit line for vertical tracking of at least one of the plurality of bit lines using a second predefined loopback; and
   a control circuit comprising:
      a precharge generator for generating a precharge signal that pre-charges the reference bit line and at least one of the plurality of bit lines to a first predefined threshold voltage;
      a word line clock generator for generating a word line enable signal based on voltage of the bit line and the reference bit line reaching the first predefined threshold voltage; and
      a sense amplifier enable generator for activating the sense amplifier of the plurality of sense amplifiers for performing a read operation.

2. The zero leakage ROM of claim 1, wherein the first predefined loopback is about fifty (50) percent loopback of reference word line clock signal, wherein the reference word line clock signal is generated in the control circuit.

3. The zero leakage ROM of claim 1, wherein the second predefined loopback is about fifty (50) percent loopback of signal generated on the reference bit line.

4. The zero leakage ROM of claim 1, wherein the reference bit line column further comprises a plurality of reference memory cells, the plurality of reference memory cells being equal in number to the number of memory cells connected to at least one of the plurality of bit lines.

5. The zero leakage ROM of claim 1, wherein the control circuit further comprises a first programmable delay circuit for programming delay of signal generated on the reference word line.

6. The zero leakage ROM of claim 1, wherein the control circuit further comprises a second programmable delay circuit for programming delay of the precharge signal.

7. The zero leakage ROM of claim 1, wherein the control circuit further comprises a reset block for programming the sense amplifier enable generator, wherein the sense amplifier enable signal activates the sense amplifier when a bit line of the plurality of bit lines and the reference bit line are discharged to a second predefined voltage.

8. A method for performing a read operation in a zero leakage read only memory (ROM) based on bit line precharge and discharge tracking, the zero leakage ROM including a plurality of bit line columns connected to a plurality of bit lines, each of the plurality of bit line columns comprising a plurality of memory cells, wherein each of the plurality of memory cells are connected to a plurality of word lines, comprising:
   initiating precharge of at least one of the plurality of bit lines and a reference bit line based on a precharge signal;
   generating a word line enable signal based on voltage of the at least one of the plurality of bit lines and voltage of the reference bit line reaching a first predefined threshold voltage;
   activating at least one of the plurality of word lines and a reference word line based on the word line enable signal;
   discharging the at least one of the plurality of bit lines and the reference bit line, wherein the reference bit line vertically tracks the bit line using a first predefined loopback; and
   activating a sense amplifier of plurality of sense amplifiers corresponding to the at least one of the plurality of bit lines based on the at least one of the plurality of bit lines and the reference bit line discharging to a second predefined threshold voltage; wherein the sense amplifier performs the read operation.

9. The method of claim 8, wherein the first predefined loopback is about fifty (50) percent loopback of signal generated in the reference bit line.

* * * * *